(12) United States Patent
Kami et al.

(10) Patent No.: US 6,696,755 B2
(45) Date of Patent: Feb. 24, 2004

(54) SEMICONDUCTOR DEVICE

(75) Inventors: Nobuharu Kami, Tokyo (JP); Kazuhiko Kurata, Tokyo (JP); Satoshi Doumae, Tokyo (JP); Takara Sugimoto, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/389,121

(22) Filed: Mar. 14, 2003

(65) Prior Publication Data
US 2003/0173663 A1 Sep. 18, 2003

(30) Foreign Application Priority Data
Mar. 14, 2002 (JP) .......................... 2002-071114

(51) Int. Cl.⁷ .............................................. H01L 23/34
(52) U.S. Cl. ..................... 257/728; 722/433; 722/434; 361/709
(58) Field of Search ................................ 257/728, 722, 257/433, 434, 675, 733, 680, 116–118, 502, 510, 514, 622; 361/676, 687, 688, 697, 702–704, 709

(56) References Cited
U.S. PATENT DOCUMENTS

| 5,561,323 A | * 10/1996 | Wildermuth | ............... 257/707 |
| 5,616,520 A | * 4/1997 | Nishiuma et al. | ............... 438/125 |
| 5,639,989 A | * 6/1997 | Higgins, III | ........... 174/35 MS |
| 5,650,918 A | * 7/1997 | Suzuki | ........................ 361/760 |
| 6,586,827 B2 | * 7/2003 | Takeuchi et al. | ............. 257/687 |

OTHER PUBLICATIONS

"Microsystems and Wafer Processes for Volume Production of Highly Reliable Fiber Optic Components for Telecom–and Datacom–Application", Althaus et al., *IEEE Transactions on Compositions, Packaging, and Manufacturing Technology*, Part B, vol. 21, No. 2, May, 1998, pp. 147–156.

"A Surface Mount Type Single–Mode Laser Module Using Passive Alignment", Kurata et al., IEEE, 1995, pp. 759–765.

* cited by examiner

*Primary Examiner*—Jasmine Clark
(74) *Attorney, Agent, or Firm*—Hayes Soloway P.C.

(57) ABSTRACT

A semiconductor device comprises: an insulating flexible film capable of changing its profile; first and second conductive layers provided on both surfaces of the flexible film and constituting wiring patterns; an LSI mounted on the first conductive layer; a conductor provided in a hole formed in the flexible film and making connection between the wiring pattern formed in the first conductive layer and the wiring pattern formed in the second wiring pattern; a stiffener; and a heat spreader. A part of the wiring pattern constituted by each of the first conductive layer and the second wiring pattern is a conductive wiring, whose characteristic impedance is previously calculated, for a high-speed signal and a connection portion for making connection to a mother board is provided on an end of the conductive wiring for a high-speed signal. Thus the semiconductor device is able to have a high heat removal ability without sacrificing its electrical performance and enables time efficiency in package design associated with package assembly and reduced assembly cost.

24 Claims, 13 Drawing Sheets

SEMICONDUCTOR DEVICE

BACKGROUND OF THE INVENTION

1. Field of the Invention

The present invention relates to a semiconductor device having an improved semiconductor package structure, and particularly to a semiconductor device incorporating therein optical elements such as a photosensitive element or a light emitting element.

2. Description of the Related Art

In recent years, an optical transceiver suitable for use in a data communication system typified such as by Local Area Network (LAN) needs to operate at higher speed and be fabricated at lower cost and in smaller size. Typically, the optical transceiver has provided therein a Laser Diode (LD) and a Photo Diode (PD) in addition to an electrical circuit such as a Large Scale Integrated Circuit (hereinafter, referred to as LSI). Furthermore, in terms of optimal design for optical system, optimal packaging and optimal sealing, an optical element needs to be handled in a manner different from that employed to handle an LSI, etc., causing the cost of an entire package to increase.

In order to lower the cost of a package, approach to packaging optical elements has been made and a packaging substrate referred to as a CAN package or a Si bench has been proposed. The CAN package is constructed such that only optical elements are mounted on a Si substrate (hereinafter, referred to also as optical element mounting substrate), etc., on a transmission-side or components ranging from optical elements to a front-end IC (amplifier) are mounted on a Si substrate, etc., on a reception-side and those elements or components are hermetic sealed, and further, a signal is retrieved via a lead line (Hans L. Althaus et. al. IEEE TRANSACTIONS ON COMPONENTS, AND MANUFACTURING TECHNOLOGY vol. 21, pp. 147–156, May 1998). That is, LD, PD, etc., mounted on a Si substrate or the like are sealed within a housing and an input/output signal to and from LD or PD is transmitted via a lead line extended outside the housing. A Si bench generally has high thermal conductivity and is an assembly substrate comprising a Si substrate advantageous for incorporating thereon optical elements and selected in terms of flatness and workability, optical elements mounted on the Si substrate, and a resin encapsulating the Si substrate together with the optical elements (K. Kurata et al. Proc. Conf. 45th ECTC pp. 759–765 1995).

However, the CAN package has the following drawbacks. That is, in the CAN package, a signal is transmitted via a lead line and when a high-frequency signal is transmitted, large parasitic inductance and large parasitic capacitance generated within the CAN package prevent the signal from being transmitted at high speed. Furthermore, it is preferable to dispose a driver LSI (Large Scale IC) in the vicinity of an optical element that outputs and/or receives a weak signal. However, in the case of CAN package, since the optical element such as a PD or an LD is sealed within a housing, reduction of a distance between the optical element and the driver LSI becomes limited. Moreover, since the optical element is sealed within the housing, thermal conductivity of the CAN package unfavorably is lowered.

Furthermore, in the case of Si bench, since optical elements are mounted on a Si substrate, an LSI formed on the Si substrate can also be mounted in the vicinity of the optical elements and further, since the Si substrate has high thermal conductivity, the Si substrate has a high heat removal ability. However, an insulation film formed on the Si substrate is thin since the film is formed by thermally oxidizing the Si substrate and therefore, a problem occurs when a signal is transmitted within the Si bench, in other words, a signal is not transmitted at high speed within the Si bench.

As described above, the conventional technique does not yet provide a semiconductor device that is free from the above-stated problems, i. e., enables a signal to be transmitted at high speed within the device and further allows the optical elements to easily be mounted therein. In more detail, when modulating a signal at high frequency on the order of not less than about 1 GHz, parasitic capacitance due to the assembling probably makes device performance significantly degraded and accordingly, both a package design and an LSI design cannot be made without an analogue design technique for designing an optimal circuit taking into account how to incorporate leads of package, which leads have been assembled within the device in a compact manner, in addition to how to incorporate a mother board within the device and how to eliminate parasitic capacitance generated within the device.

For example, in the case of CAN package, etc., the parasitic inductance of a lead line and the parasitic capacitance of a bonding wire used to make connection of the optical element to the lead line largely affect device performance. Therefore, for example, when a transmission side is designed such that a driver LSI for driving an optical element is mounted on a mother board and a CAN package is connected to the mother board, an entire package should be designed taking into account the influence of the above-described parasitic inductance and parasitic capacitance.

Moreover, when the Si substrate, etc., is employed as a substrate that is used to mount an optical element thereon, the optical element is typically connected by wire bonding to the mother board on which a variety of LSIs for performing various processing are mounted. In this case, the inductance component of the wire acts as a reflection point that significantly echoes an electrical signal when the signal is modulated at high frequency and in addition, the wire needs to be encapsulated with a resin, thereby increasing the assembling cost. Additionally, since the Si substrate generally has interconnect lines formed on a silicon dioxide ($SiO_2$) film as an insulation film, which is formed on the surface of the substrate by thermally oxidizing the substrate, the parasitic capacitance of the device consisting of the substrate is large and the device is not suitable for high frequency drive. For this reason, the $SiO_2$ film has been formed to have a large film thickness. However, forming the $SiO_2$ film to a large thickness unfavorably lowers the productivity of semiconductor device and its availability.

This increases the need for a highly advanced substrate capable of transmitting a signal at high frequency within the substrate and assembling optical elements in a compact manner. Furthermore, the development of a semiconductor package structure is indispensable for reduction of the cost of an optical transceiver, which structure can be constructed such that microelectronic components are physically assembled in the same manner as that employed in the conventional technique and electrically assembled in a complete fashion as well without taking into account how to incorporate therein optical elements when designing an entire package.

SUMMARY OF THE INVENTION

An object of the present invention is to provide a semiconductor package structure and having a high heat removal ability without sacrificing its electrical performance at high frequency and further, enabling time efficiency in package design associated with packaging or mounting and reduced packaging cost.

A semiconductor device according to the present invention comprises: an insulating film; first and second conductive layers formed on both surfaces of the insulating film and constituting wiring patterns respectively, the first and second conductive layers being constructed such that a part of each of the wiring patterns formed in the first and second conductive layers is a conductive wiring for a high-speed signal, designed taking into account high frequency characteristic of the conductive wiring based on characteristic impedance of the conductive wiring; an integrated circuit mounted on the first conductive layer; and a conductor connecting the wiring pattern formed in the first conductive layer and the wiring pattern formed in the second conductive layer to one another, in which the insulating film is further constructed such that a portion of the insulating film is mounted on a substrate used to mount thereon an object, the portion being occupied by the integrated circuit, and a connection portion for making connection to a different substrate is provided at an end of the insulating film located outside the substrate used to mount thereon an object.

The semiconductor device is constructed so that the insulating film is, for example, an insulating flexible film capable of changing a profile of the insulating flexible film and the substrate used to mount thereon an object is, for example, a silicon substrate or a metal substrate.

Preferably, the semiconductor device further comprises: a stiffener made of metal or alloy, and mounted on a circumference of the integrated circuit on the insulating film; a heat spreader supported by the stiffener and contacting the integrated circuit. Additionally, the device further comprises a heat sink provided to contact the heat spreader and having a plurality of fins provided therein.

A first semiconductor device incorporating optical elements therein comprises: an optical element mounted on the substrate used to mount thereon an object; a third conductive layer provided on the substrate used to mount thereon an object and constituting a wiring pattern; and a connection portion making electrical connection between the wiring pattern formed in the third conductive layer and the wiring pattern formed in the second conductive layer, and made from a solder or a gold bump.

The first semiconductor device incorporating therein optical elements is, for example, constructed such that an optical axis of the optical element is parallel to a surface of the substrate used to mount thereon an object and the device further includes: a side plate disposed on a side surface of the substrate used to mount thereon an object; a transparent window provided at a position of the side plate, the position being determined such that the side plate and the optical axis cross one another; and a transparent resin filling a space between the optical element and the transparent window. Moreover, the device, for example, further includes another integrated circuit mounted on the third conductive layer on the substrate used to mount thereon an object. Additionally, the device is, for example, constructed such that an optical axis of the optical element extends toward a surface of the substrate used to mount thereon an object in a direction vertical to the surface of the substrate used to mount thereon an object and the device further includes: a light reflecting portion formed of an inclined surface and provided at a position of a surface of the substrate used to mount thereon an object, the position being determined such that the surface and the optical axis cross one another; a side plate disposed on a side surface of the substrate used to mount thereon an object; a transparent window provided at a position of the side plate, the position being determined such that the side plate and the optical axis cross one another; and a transparent resin filling a space between the optical element and the transparent window. Moreover, the device is, for example, constructed such that the substrate used to mount thereon an object is a silicon substrate and the inclined surface is formed by etching with KOH, and a metal film is formed on the inclined surface by metallization to constitute the light reflecting portion. Alternatively, the device is constructed such that the substrate used to mount thereon an object is a metal substrate and the inclined surface is formed by mechanical processing to constitute the light reflecting portion.

A second semiconductor device incorporating optical elements therein in accordance with the present invention includes: an optical element mounted on the first conductive layer on the insulating film; a third conductive layer provided on the substrate used to mount thereon an object and constituting a wiring pattern; and a connection portion making electrical connection between the wiring pattern formed in the third conductive layer and the wiring pattern formed in the second conductive layer, and made from a solder or a gold bump.

The second semiconductor device incorporating optical elements therein is, for example, constructed such that an optical axis of the optical element extends toward a surface of the insulating film in a direction vertical to the surface of the insulating film and the device further includes: a hole or a transparent portion provided at a position of the insulating film, the position being determined such that the insulating film and the optical axis cross one another; a light reflecting portion for changing an orientation of the optical axis; a side plate disposed on a side surface of the substrate used to mount thereon an object; and a transparent window provided at a position of the side plate, the position being determined such that the side plate and the optical axis cross one another. Additionally, the device is, for example, constructed such that the light reflecting portion includes: an inclined surface formed on a surface of the substrate used to mount thereon an object; and a metal film formed on the inclined surface by metallizing the inclined surface. Moreover, the device is, for example, constructed such that an optical axis of the optical element extends remotely from a surface of the insulating film in a direction vertical to the surface of the insulating film and the device further includes: a light reflecting portion for changing an orientation of the optical axis in order to make the optical axis parallel to a surface of the substrate used to mount thereon an object; a side plate disposed on a side surface of the substrate used to mount thereon an object; and a transparent window provided at a position of the side plate, the position being determined such that the side plate and the optical axis cross one another. Still furthermore, the device is, for example, constructed such that the light reflecting portion is constituted by an inclined surface made from a metal member or an alloy member, and provided on a side opposite the optical element relative to the insulating film. Additionally, the device, for example, includes a lens disposed on the optical axis between the light reflecting portion and the inclined surface. In this case, the lens is a semi-spherical material provided in the inclined surface of the light reflecting portion and having a refractive index different from a refractive index of a portion surrounding the material. Moreover, a region between the optical element and the lens is preferably filled with a transparent resin.

Furthermore, in the present invention, for example, the substrate used to mount thereon an object includes: a fourth conductive layer formed on a rear surface of the substrate used to mount thereon an object; and a conductive layer for making electrical connection between the wiring pattern constituted by the third conductive layer and a wiring pattern constituted by the fourth conductive layer. In this case, the device according to the present invention preferably includes a fifth conductive layer formed on a surface of the another substrate, in which the substrate used to mount thereon an object is mounted on the another substrate and the wiring pattern constituted by the fourth conductive layer and a wiring pattern constituted by the fifth conductive layer are connected to one another. Moreover, the fourth conductive layer and the fifth conductive layer are preferably connected to one another through a solder or a gold bump.

Additionally, in the present invention, for example, the optical element constitutes two optical elements provided on the substrate used to mount thereon an object and the two optical elements consist are a photo sensitive element and a light emitting element respectively, and the semiconductor device further includes: an optical fiber disposed in a V-shaped groove provided in a surface portion of the substrate used to mount thereon an object; and a light guide for making optical connection between the photo sensitive element and the optical fiber and between the light emitting element and the optical fiber.

Moreover, in the present invention, for example, the integrated circuit includes: a pair of a first transmission integrated circuit and a first reception integrated circuit, mounted on one end of the first conductive layer; and a pair of a second transmission integrated circuit and a second reception integrated circuit, mounted on the other end of the first conductive layer and disposed at a location symmetric with respect to a point corresponding to the pair of the first transmission integrated circuit and the first reception integrated circuit, in which an input of the first transmission integrated circuit and an output of the second reception integrated circuit are connected to one another, and an output of the first reception integrated circuit and an input of the second transmission integrated circuit are connected to one another, and corresponding connection between the output and the input is made through the conductive wiring, formed in at least one of the first and second conductive layers, for a high-speed signal.

In the present invention, the first and second conductive layers are formed on front and rear surfaces of the insulating film and a part of each of the wiring patterns formed as the first and second conductive layers is made to be a conductive wiring provided for high-speed signal and designed taking into account its high frequency characteristic based on its characteristic impedance, and then, the LSI needed to provide advantage of transmitting a signal at high frequency is mounted on the insulating film, and further, a pad, formed on the integrated circuit, for high-speed signal is connected to the connection portion by making use of the conductive wiring for high-speed signal. Since the insulating film is formed in a manner different from that employed to form an insulating film on a Si substrate by means of thermal oxidation and can be formed to have a sufficient thickness, the wiring patterns constituted by the first and second conductive layers that are formed on front and rear surfaces of the insulating film are extremely advantageous for transmitting a signal at high speed and further can easily be designed to provide an advantage of transmitting a signal at high speed. Additionally, the optical element is mounted on a substrate for incorporating thereon an object, such as a Si substrate or a metal substrate having an advantage of incorporating thereon an element. Then, the insulating film is mounted on the substrate for incorporating thereon an object and electrical and mechanical connections are made therebetween, thereby achieving a semiconductor device that provides an advantage of transmitting a signal at high speed and incorporating therein an optical element in a compact manner. In addition, when the insulating film is an insulating flexible film capable of changing its profile, connection of the conductive wiring for high-speed signal to a different substrate can be made facilitated.

In a detailed aspect of the present invention, conductive layers are formed on both surfaces of the flexible film and wiring patterns are formed in the conductive layers on both surfaces of the flexible film made of an insulator capable of changing its profile to some extent, and if necessary, the wiring patterns on both surfaces of the flexible film are connected to one another through a conductor embedded in a hole 9 such as a via hole or a through hole. In this case, forming the wiring pattern in the conductive layer on at least one surface of the flexible film and on a part of the flexible film forms a transmission line (hereinafter, referred to as a conductive wiring for high-speed signal) whose characteristic impedance is previously and desirably calculated. Subsequently, an integrated circuit (hereinafter, referred to as LSI) is flip-chip mounted on the upper conductive layer and a microelectronic component such as a capacitor is mounted on the upper conductive layer, and a mass block (hereinafter, referred to as stiffener) having approximately the same height as those microelectronic components, i. e., the LSI and the capacitor, is mounted on a part of the flexible film so as not to adversely affect the characteristic impedance of the conductive wiring for high-speed signal. Furthermore, a heat spreader made of a metal plate having high electrical conductivity and high thermal conductivity is mounted on the flexible film and connected to the stiffener and the LSI so as to cover the LSI. Thus, an inexpensive package structure having an advantageous heat removal mechanism and improved efficiency in package assembly can be obtained.

DETAILED DESCRIPTION OF THE PREFERRED EMBODIMENTS

Figure 1:
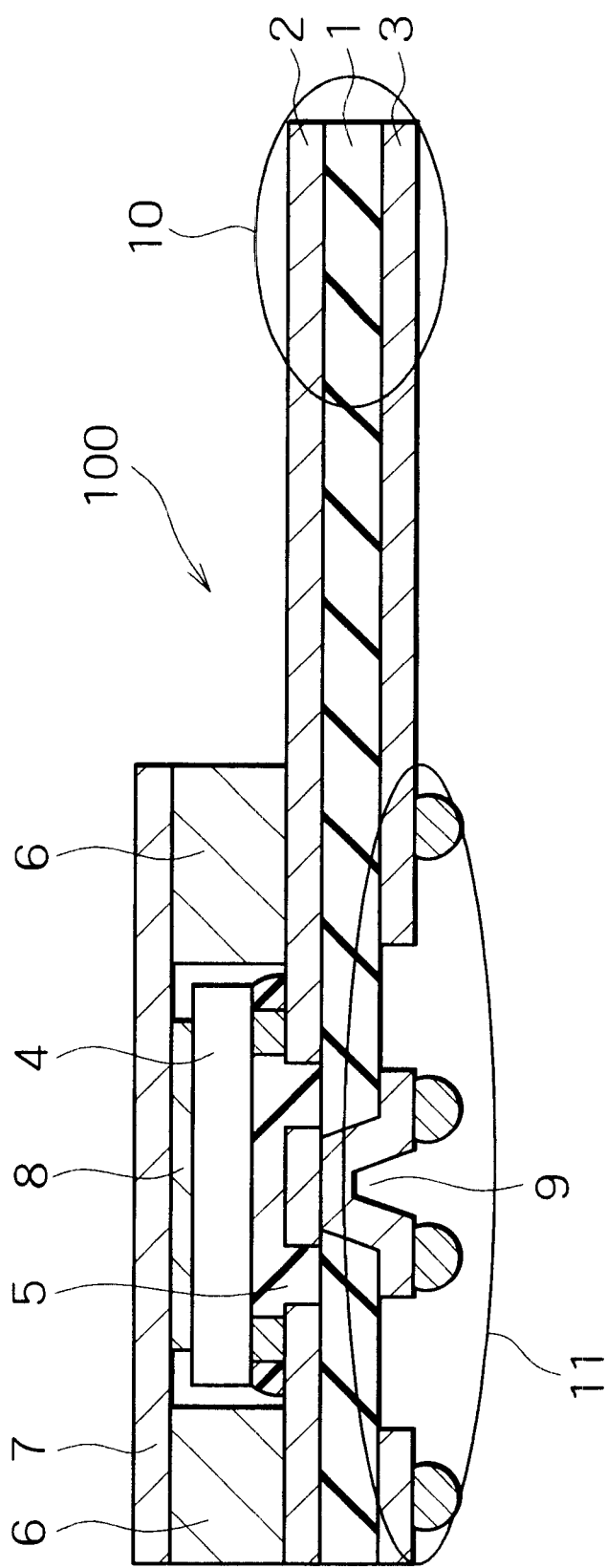
FIG. 1 is a diagram illustrating a flexible sub-package according to a first embodiment of the present invention.
Figure 2:
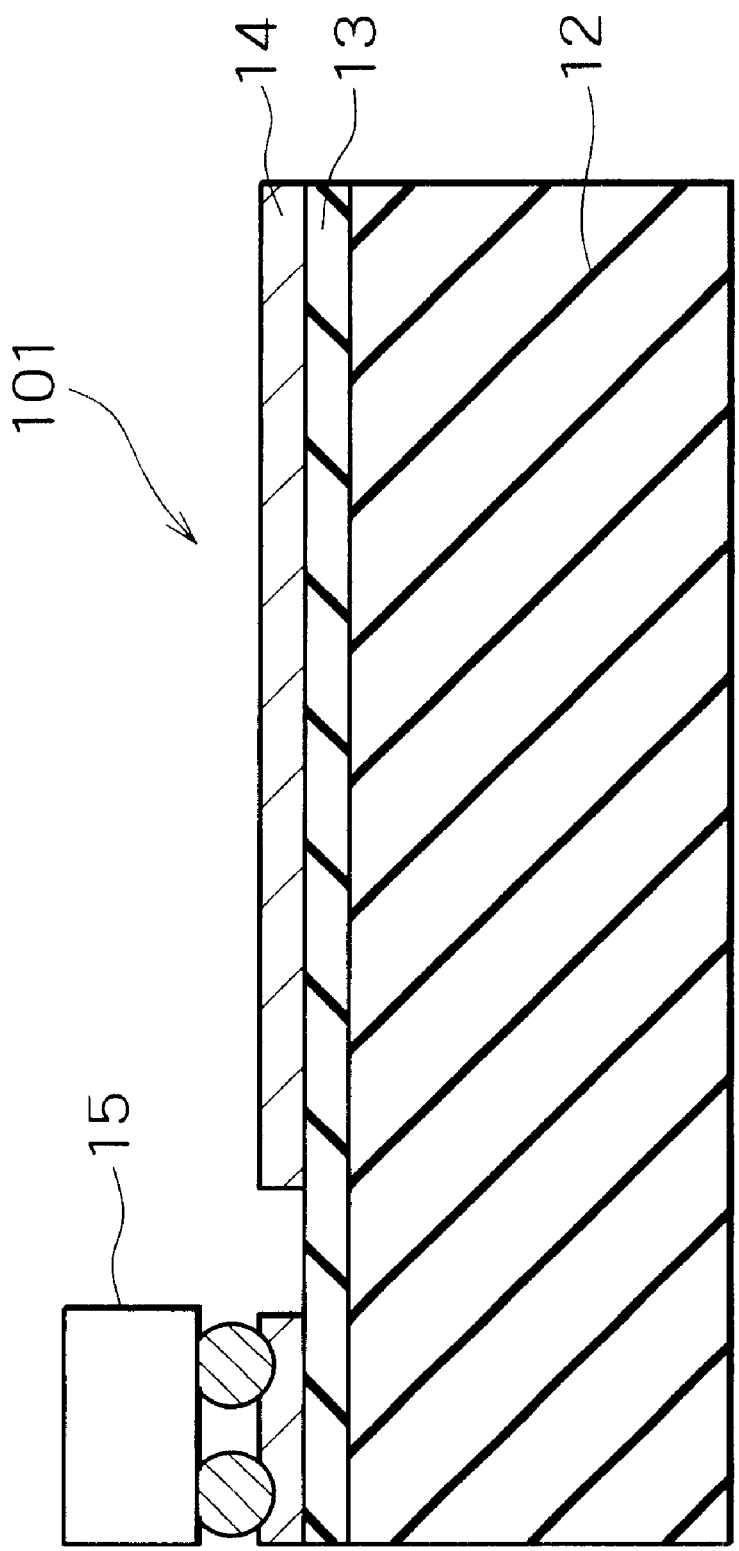
FIG. 2 is a diagram illustrating a mounting substrate used to mount thereon a light emitting element according to the first embodiment.
Figure 3:
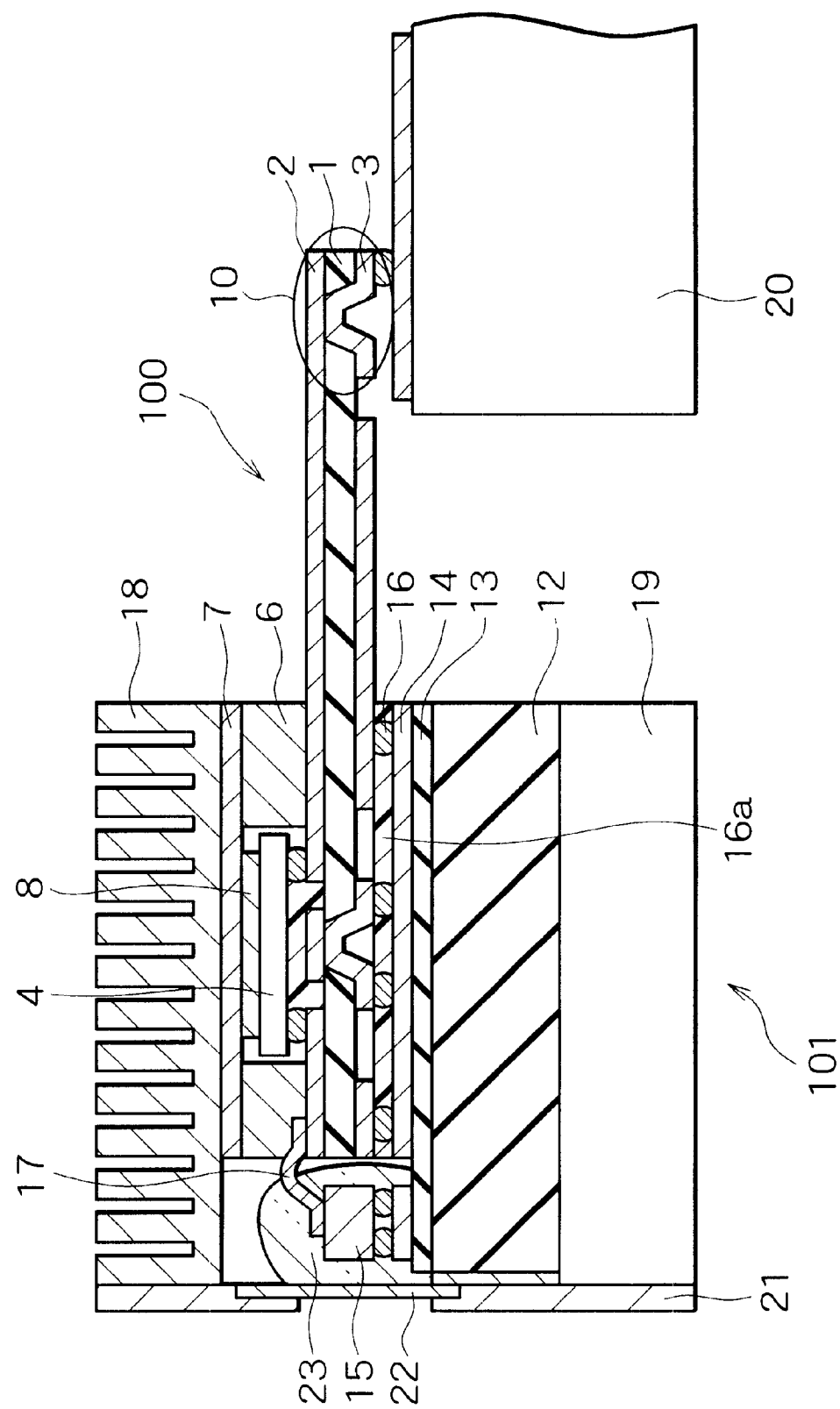
FIG. 3 is a diagram illustrating a package after being assembled according to the first embodiment.

Embodiments of the present invention will be explained in detail below with reference to the attached drawings. FIGS. 1 to 3 are diagrams illustrating a semiconductor device according to a first embodiment of the present invention. FIG. 1 illustrates a flexible sub-package and FIG. 2 illustrates a transmission-side Si bench (a mounting substrate used to mount thereon a light emitting element), and FIG. 3 illustrates a semiconductor device after being assembled. In more detail, FIG. 3 is a diagram illustrating a situation (semiconductor package structure) where the transmission-side flexible sub-package shown in FIG. 1 and the optical element mounting substrate shown in FIG. 2 and having a light emitting element mounted thereon are coupled together, and then a heat sink and a plate for retaining a glass window are mounted thereon, and an entire structure thus obtained is encapsulated with a resin, and thereafter, the encapsulated structure is coupled to a different board.

The flexible film 1 has conductive layers 2, 3 provided on front and rear surfaces thereof and the conductive layers 2, 3 are patterned to form wiring patterns. A driver LSI 4 for driving a semiconductor light emitting element is flip-chip mounted on an one end (left end in the figure shown) of the flexible film 1 and in order to maintain reliability of connection between the LSI 4 and the flexible film 1, a space therebetween is filled with an underfill resin 5.

Furthermore, microelectronic components (not shown) such as a capacitor and a resistor are mounted on the flexible film 1 and a stiffener 6 as a mass block having approximately the same height as those microelectronic components is mounted in a suitable space around the LSI 4 on the flexible film 1. Then, a heat spreader 7 made from a metal plate of an appropriate size and having high thermal conductivity is mounted on the stiffener 6, and a filler 8 made of a gel material having high thermal conductivity is provided to fill a space between the LSI 4 as a heat source and the heat spreader 7 as a heat radiator, thereby making the LSI 4 and the heat spreader 7 thermally contact one another. Thus, a flexible sub-package 100 is assembled.

In the flexible sub-package 100, an upper wiring pattern formed in the conductive layer 2 and a lower wiring pattern formed in the conductive layer 3 are connected together as necessary through conductors formed within holes 9 such as a via hole or a through hole provided in the flexible film 1. A conductive wiring provided for a high-speed signal and made from a transmission wiring whose characteristic impedance is previously calculated is extended from a pad, provided in the LSI on the flexible film 1, for a high-speed signal to an interface 10 at an end of the flexible film 1. The conductive wiring for a high-speed signal is a conductive wiring provided for transmitting a signal at high speed and designed taking into account its high frequency characteristic based on its characteristic impedance, and is formed as a part of the upper wiring pattern made from the conductive layer 2 on the surface of the flexible film 1. Furthermore, since the conductive wiring for a high-speed signal is laterally extended to the outside traveling on the upper surface of the flexible film 1, the conductive wiring can change its profile. Moreover, in addition to the conductive wiring for a high-speed signal, a conductive wiring for a continuous signal such as a power supply signal and a control signal or a conductive wiring for a low-speed signal may be formed in the conductive layers 2, 3 on the flexible film 1. In this case, in order to make the characteristic impedance free from the influence of the stiffener 6, it is desirable to mount the stiffener so that the stiffener never contacts the conductive wiring for a high-speed signal. A pad and an interface pattern 11, both of which are formed in the conductive layer 3 on the lower surface of the flexible film 1, if necessary, are electrically connected to the wiring pattern formed in the conductive layer 2 on the upper surface of the flexible film 1 through conductors provided in holes 9 such as a via hole and a through hole. Note that the lower wiring pattern made from the conductive layer 3 on the rear surface of the flexible film is formed over the entire rear surface of the flexible film 1 and connected to the ground (GND).

It should be appreciated that the flexible film 1 has a transmission wiring for a high-speed signal formed in an interface 10 and formed to have a thickness so that when the wiring pattern is partially formed to have a minimum line width according to a manufacturing process for forming a wiring pattern, the minimum line width does not cause failure of a transmission wiring for a high-speed signal, and further the flexible film 1 is formed using an insulator having low dielectric constant and low dielectric loss tangent in order to achieve high-speed transmission. The flexible film 1 is a material whose thermal expansion is not large and preferably, deformation of the flexible film 1 due to thermal expansion is made minimum.

As shown in FIG. 2, the $SiO_2$ film 13 is formed on the Si substrate 12 as a mounting substrate and a conductive layer 14 is formed on the $SiO_2$ film 13 to constitute a wiring pattern. A semiconductor light emitting element 15 typified such as by an LD is mounted on a conductive wiring on the Si substrate 12, on which the wiring pattern is formed, thereby constituting a transmission-side Si bench 101.

As shown in FIG. 3, the flexible sub-package 100 shown in FIG. 1 and transmission-side Si bench 101 shown in FIG. 2 are electrically connected to one another by connecting the interface 11 of the flexible sub-package 100 and the conductive layer 14 as a wiring pattern on the transmission-side Si bench 101 through an Au bump 16 or a solder, and a space between the interface 11 and the conductive layer 14 is filled with an underfill resin 16a to mechanically fix the flexible sub-package 100 and the transmission-side Si bench 101. Furthermore, if necessary, the flexible film 1 and the transmission-side Si bench 101 can also be electrically connected to one another. Moreover, a conductive wiring (conductive layer 2) formed on the flexible film 1 and the light emitting element 15 or a conductive wiring (conductive layer 14) formed on the transmission-side Si bench 101 can also be connected to one another by wire bonding using an Au bonding wire 17, etc. However, a package structure that has the interface 11 of the flexible sub-package 100 and the conductive layer 14 as a wiring pattern on the transmission-side Si bench 101 electrically connected to one another through the Au bump 16 or a solder is more preferable for the embodiment since the assemble structure does not contain a component such as a bonding wire that increases the amount of reflection of an electrical signal, i. e., the assemble structure can contain the associated components connected to one another keeping parasitic capacitance to a minimum.

The heat spreader 7 additionally has a package or a heat sink 18 thermally coupled thereto, thereby efficiently removing heat radiated from the LSI 4 and efficiently cooling the LSI 4. Moreover, providing the Si substrate 12 on a block 19 made of metal, etc., having high thermal conductivity makes it possible to let transmission-side the Si bench 101 efficiently radiate heat through the block 19, thereby making the light emitting element 15 efficiently radiate heat.

The Si substrate 2 as a mounting substrate used to mount thereon a light emitting element is mounted on the metal block 19 and the metal block 19 has a metal plate 21 bonded to the side surface of the block 19 to fix the substrate to the block. The metal plate 21 has provided therein a window 22 made from a glass plate and when the light emitting element 15 is an element such as an LD that emits light from the end surface thereof, an optical axis of the light emitting element 15 is parallel to the surface of the Si substrate 12, and as shown in FIG. 3, the metal plate 21 is fixed to the block 19 so that the window 22 made from a glass plate is disposed to have its orientation vertical to the optical axis of the light emitting element 15. Then, a space between the window 22 made from a glass plate and the light emitting element 15 such as an LD is filled with a potting resin 23 to encapsulate the light emitting element 15 with the resin.

As described above, the assembled semiconductor device is connected to a mother board 20, which is disposed at a position apart from the device, through the interface 10 of the device by means of a gold bump or a solder, as shown in FIG. 3. In this case, since the interface 10 is configured to have a conductive wiring formed on the flexible film 1 whose profile flexibly changes, connection between the interface 10 and the mother board 20 can easily be made. Furthermore, since the connection therebetween can be made without using a bonding wire, it is not required to encapsulate the interface with a potting resin, etc. Additionally, if necessary, in order to maintain the strength and reliability of the connection therebetween, the interface may be encapsulated with an underfill resin injected into the associated portion of the interface, advantageously lowering the assembly cost and the fabrication cost.

Moreover, the conductive wiring, formed in the interface 10, for a high-speed signal is able to transmits a signal from a connection point between an end of the flexible film 1 and the mother board to a pad of the LSI 4 without making the signal pass through discrete points. Therefore, since the inventive semiconductor device does not contain a component that forms a reflection point and significantly echoes an electrical signal when a high frequency signal is transmitted, the device allows transmission of a high-speed signal while maintaining easiness of connection between associated components, which operation is advantageous over that of the conventional semiconductor device connected to a mother board through a bonding wire or a package lead.

Furthermore, the semiconductor device of the embodiment can be configured to have the interface 10 as a digital interface and when the interface is connected to an LSI which is terminated with an appropriate impedance or whose output impedance is made preferable, the device allows secure transmission of a high-speed signal and eliminates the need for an analogue signal processing technique. Accordingly, the device makes it possible to design an interface by just equalizing signal levels at the LSI 4 on the mounting substrate used to mount thereon microelectronic elements and at an LSI mounted on the mother board 20 when electrically connecting the two LSIs together, meaning that a device designer is advantageously able to design a package just taking into account the impedance of an entire package without considering the existence of the light emitting element 15, which designing operation is similar to that performed when designing a BGA or the like.

As described above, connecting together the flexible sub-package shown in FIG. 1 and the Si bench on which the light emitting element 15 shown in FIG. 2 is mounted makes it possible to obtain a semiconductor device that is assembled in a simplified and sophisticated manner and at low cost, and further, produces an advantage of transmitting a signal at high frequency.

The inventive semiconductor device can also be configured to mount the light emitting element 15 mounted on the transmission-side Si bench directly on the conductive wiring (conductive layer 2) on the flexible film 1 and employ the transmission-side Si bench just for fixing a mounting base used to mount thereon the light emitting element 15 of the flexible film 1. In this case, pads, not in use for transmission of signal, of the flexible film 1 may be fixed to the transmission-side Si bench through a gold bump, etc. Furthermore, when heat from the light emitting element 15 has to be removed since it adversely affects the device, vias for removing heat from the device are formed on a portion of the flexible film 1 directly below the light emitting element 15 and made to thermally contact the transmission-side Si bench in order to efficiently remove heat from the device.

The inventive package structure consisting of the semiconductor device is characterized in that the structure has two interfaces provided therein, i. e., an interface 11 for a low-speed signal and an interface 10 for a high-speed signal. An interface is, for example, a connection pad formed in a conductive layer on the lower surface of the flexible film and is connected to a different substrate (hereinafter, referred to as a substrate 1) through a solder bump, a gold bump or the like, and if necessary, is connected to a conductive wiring formed in an upper conductive layer by way of a via hole or a through hole in order to electrically be connected to an LSI, etc. A relatively low-speed signal that needs not to take into account the characteristic impedance of a transmission wiring through which the signal is transmitted or a signal that is terminated immediately before its entry to the structure is connected to the different board 1 through the interface 11. The interface 10 has a transmission wiring, whose characteristic impedance is previously calculated, provided on a part of the flexible film and is connected to the substrate 1 or a different substrate (hereinafter, referred to as a substrate 2) through the flexible film, and further, a conductive wiring for a high-speed signal is extended from an input/output pad, provided on the LSI, for a high-speed signal directly to the end of the flexible film. Accordingly, the package structure incorporating the interface 10 therein is able to efficiently reduce the number of reflection points constituted by a via, a bonding wire and the like, producing an advantage of transmitting a signal at high speed.

Simultaneously, the above-described two interfaces allow the inventive package structure to make connection of a signal to a plurality of substrates. The interface 11 is used to make both mechanical and electrical connection of the structure to the substrate 1 and is primarily used by a low-speed signal or a signal that is terminated immediately before the entry to the structure. The interface 10 is characterized in that the flexible film is able to arbitrarily change its profile and therefore enables easy connection of the structure to the different substrate 2 in addition to the substrate 1. As described above, the interface 10 is able to have provided therein a conductive wiring for a different signal that should be connected to the substrate 2 in addition to a conductive wiring for a high-speed signal.

It should be appreciated that the transmission-side Si bench 101 can be realized by employing a substrate made of metal or alloy, or made from a ceramic substrate, instead of the Si substrate 12.

A second embodiment of the present invention will be explained in detail below with reference to FIG. 4. A reception-side Si bench is constructed such that a Si substrate 52 has a step 51 on a surface of the substrate on a side thereof on which a metal plate 21 is disposed and an inclined surface of the step 51 is covered with a metal film to be able to reflect a light beam incident on the inclined surface. A silicon dioxide ($SiO_2$) film 53 is formed on the silicon substrate 52 having the step 51 and a conductive layer 54 constituting a wiring pattern is formed on the $SiO_2$ film 53. Furthermore, a flexible sub-package of the embodiment is constructed such that instead of the LSI 4 for driving a semiconductor light emitting element, an amplification LSI 55 such as a trans-impedance amplifier (hereinafter, referred to as TIA) and a photo sensitive element 56 such as a Photo Diode (PD) having a p-i-n structure are mounted on the flexible film 1 of the first embodiment, and a hole 57 or a slit is formed just below the light-receiving surface of the photo sensitive element 56. Additionally, as is the case with the first embodiment, a stiffener 6 and a heat spreader 7 are mounted on the associated portions. An interface 11 of the flexible sub-package and a conductive wiring (conductive layer 54) of the reception-side Si bench are connected to one another using a gold bump 58 or a solder, so that the photo sensitive element 56 and the hole 57 of the flexible sub-package are disposed directly above the step 51 as a reflecting surface of the reception-side Si bench. Moreover, as is the case with the first embodiment, a space between the flexible sub-package and the Si substrate 52 is filled with an underfill resin 58a.

Figure 4:
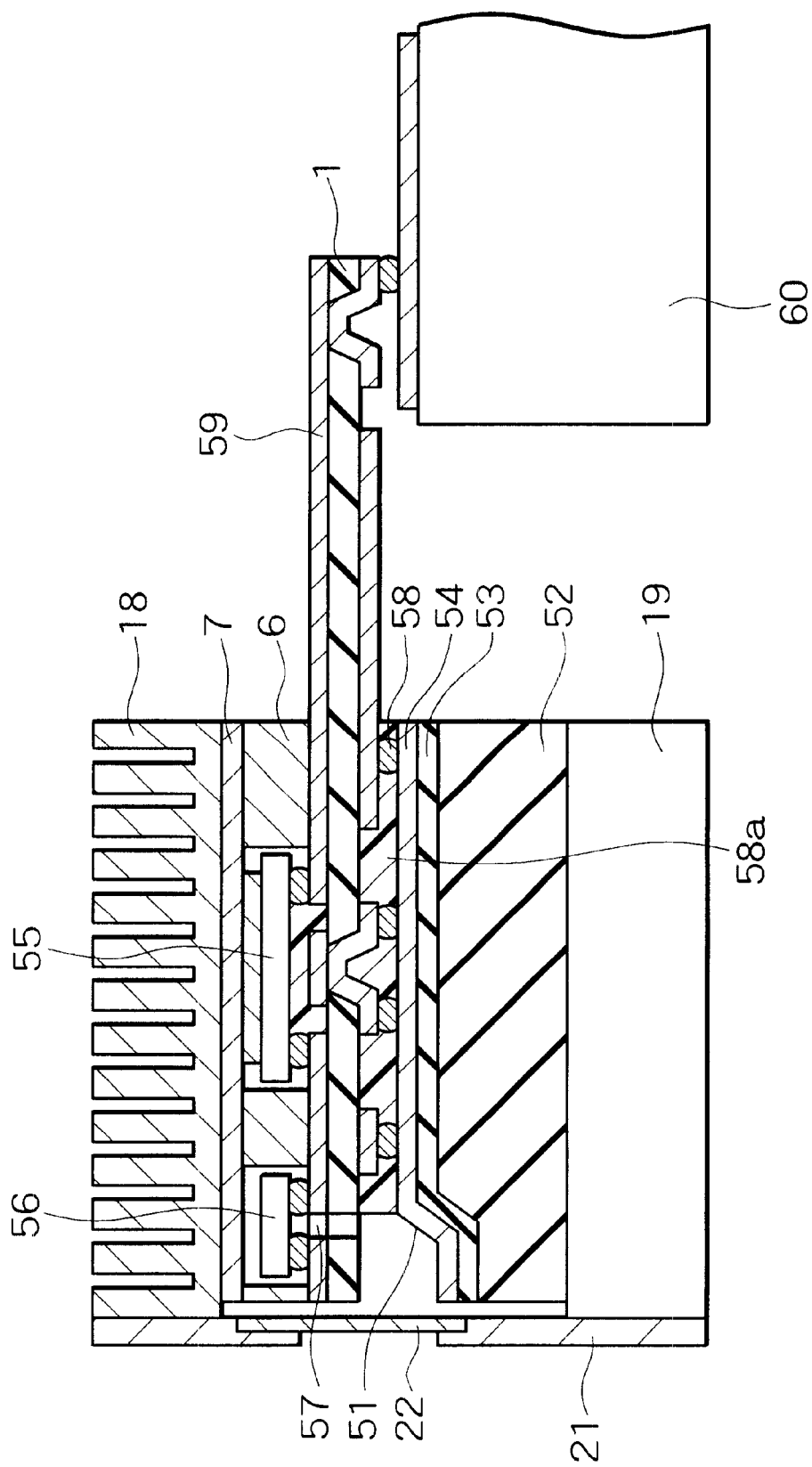
FIG. 4 illustrates a semiconductor device according to a second embodiment of the present invention.

As shown in FIG. 4, in the second embodiment constructed as described above, when viewing the paper from a direction vertical to the paper, a signal light beam incoming from the left is reflected upwardly by the step 51 and then enters the photo sensitive element 56. As is the case with the first embodiment, the reception-side semiconductor package structure is constructed such that a conductive wiring 59, whose characteristic impedance is previously calculated, for a high-speed signal is extended on the flexible film 1 from an output of the amplifier 55 to an end of the flexible film 1 and then is connected to a mother board 60 at the end thereof. Signal wirings such as a power supply wiring, a ground wiring and a variety of control signal wirings, all of which need to be connected to the mother board and are provided to supply associated signals to the amplification LSI 55 such as an TIA, and the photo sensitive element 56 such as an PD, are also provided on the flexible film.

The second embodiment produces beneficial effects as those produced by employing the first embodiment and in combination with the first embodiment, is able to constitute a transmission and reception semiconductor package structure.

Furthermore, the photo sensitive element 56 such as an PD can also be mounted on the reception-side Si bench and in this case, the amplification LSI 55 such as a TIA and the photo sensitive element 56 mounted on the flexible sub-package can be connected to one another by wire bonding or through the interface 11.

Moreover, in order for a signal to have an amplitude larger than that obtained singly through the TIA, an additional amplifier is often connected to the stage subsequent to the TIA and the amplifier (hereinafter, referred to as Post Amp) at the stage subsequent thereto can also be mounted on the flexible sub-package.

Figure 5:
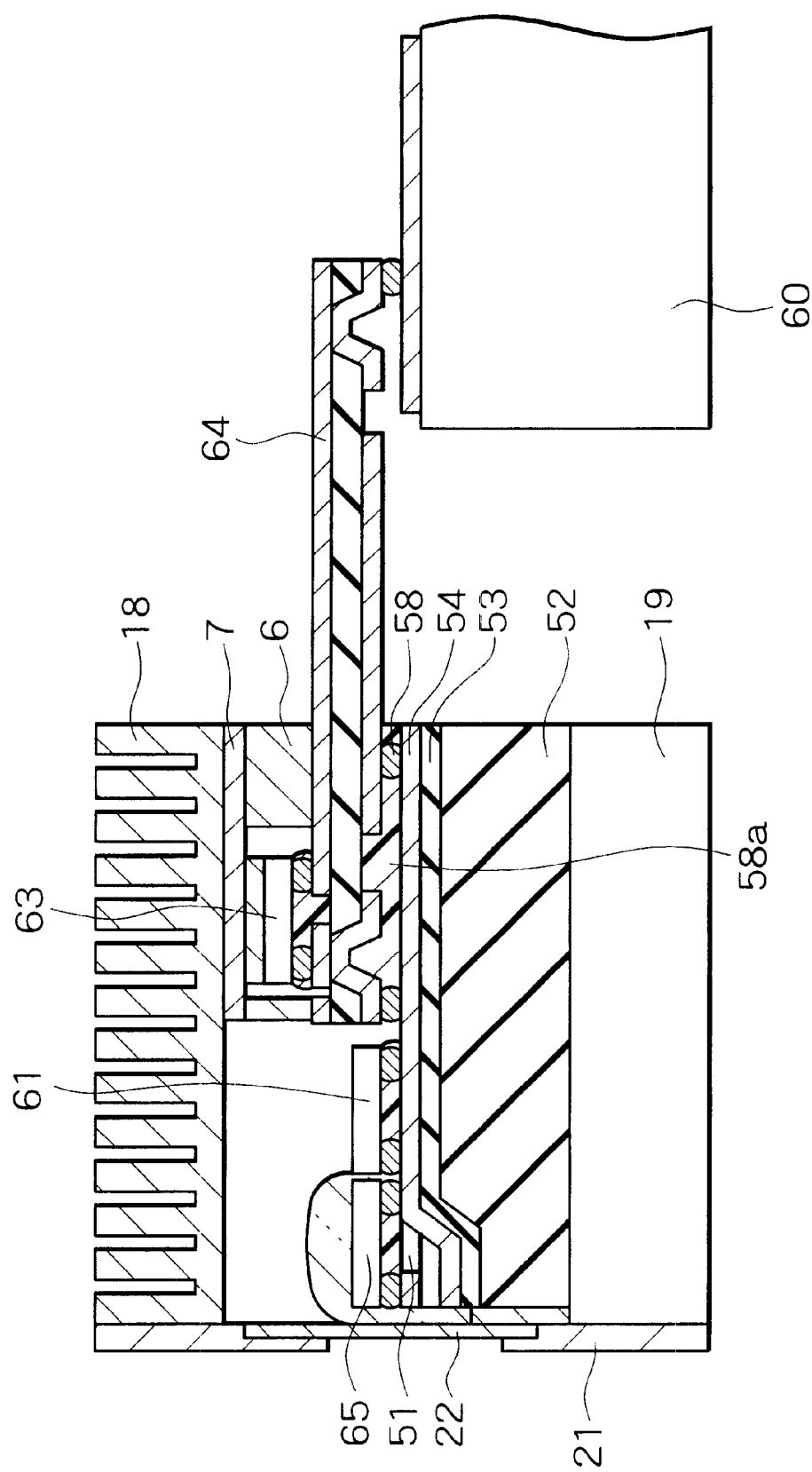
FIG. 5 illustrates a semiconductor device according to a third embodiment of the present invention.

Additionally, as shown in FIG. 5, a third embodiment can be constructed such that while a photo sensitive element 65 such as a PD is also mounted on a reception-side Si bench, an amplification LSI 61 such as a TIA is also mounted on a Si substrate 52 of the reception-side Si bench. In this case, an output signal from the amplification LSI 61 is connected to a Post Amp 63 on a flexible sub-package through an Au bump 62 or by wire bonding and an output from the Post Amp 63 is connected to a mother board 60 through a conductive wiring 64 for a high-speed signal.

Generally, amplitude of an output from a PD is extremely small and measurement of sensitivity of the PD through evaluation of static characteristics of the PD does not necessarily ensure acceptable AC characteristics of the PD. Therefore, in a situation where the PD is being mounted as the photosensitive element 65 on a mounting substrate, it is difficult to evaluate the AC characteristics of the PD as a single element and then select the PD. In effect, in many cases, the PD is selected after mounting the TIA and the Post Amp and accordingly, even when the PD is inspected as being defective, operation for determining which component out of three components actually fails becomes difficult. However, the third embodiment is configured differently from the conventional assembly (in which the PD, the TIA and the Post Amp are mounted on the same substrate) so that the reception-side Si bench on which the PD and the TIA are mounted and the flexible sub-package on which the Post Amp is mounted are independently selected to effectively remove a defective assembly before additional value is added to the assembly.

It should be noted that in the above-described second and third embodiments, although the light reflecting portion to be formed in the reception-side Si bench is formed using the step 51, instead of using the step 51, the light reflecting portion may be formed using an inclined surface formed by means of a mechanical processing such as polishing and then covered with a metal film. Furthermore, although the reception-side Si bench is made from a silicon substrate, it may be made from a substrate of a different material, such as a metal substrate or a ceramic substrate, as long as the substitutional substrate is able to have a light reflecting portion formed therein.

Moreover, the hole 57 or the slit formed in the flexible sub-package needs not to be formed, i. e., may be omitted when the flexible film 1 itself is realized by employing a transparent material. In this case, a surface of the flexible film 1 on a side thereof opposite the side on which the optical element is mounted becomes a light-incident surface on which a light beam is incident and if necessary, the light-incident surface may be configured to have an anti-reflection film formed thereon.

Additionally, in the semiconductor device shown in FIG. 4, when the flexible sub-package and the reception-side Si bench are connected using a solder bump, positional relationship of the reception-side Si bench relative to the previously-determined optical axis of the optical element mounted on the flexible film 1 can be determined in a self-aligning fashion by just melting and solidifying a solder, simplifying operation for adjusting an optical axis.

Moreover, when the flexible sub-package is constructed such that a structure having a smooth inclined surface formed therein is mounted to the flexible sub-package directly below the PD (photo sensitive element 56), which is provided on the flexible film 1, the above-described semiconductor package structure may be constructed such that the flexible sub-package having a light reflecting portion formed therein and a metal substrate or a ceramic substrate as a substitutional substrate for the above-described reception-side Si bench, which substitutional substrate is free from difficulty of making connection to the flexible sub-package, are connected to one another using an Au bump or a solder.

As is the case with the first embodiment, the second and third embodiments each comprises: a mounting substrate 52 having an optical element mounted thereon and mounted on a metal block 19; a metal plate 21 having a window 22 made from a glass plate and fixed in a direction vertical to the optical axis of the optical element to the block 19; the window 22 made from a glass plate; and photo sensitive elements 56, 65 encapsulated with a resin by filling a space therebetween with a potting resin. In addition, mounting a heat sink 18 on a heat spreader 7 allows the amplification LSI 55 and the Post Amp 63 to efficiently radiate heat to the surroundings.

Figure 6:
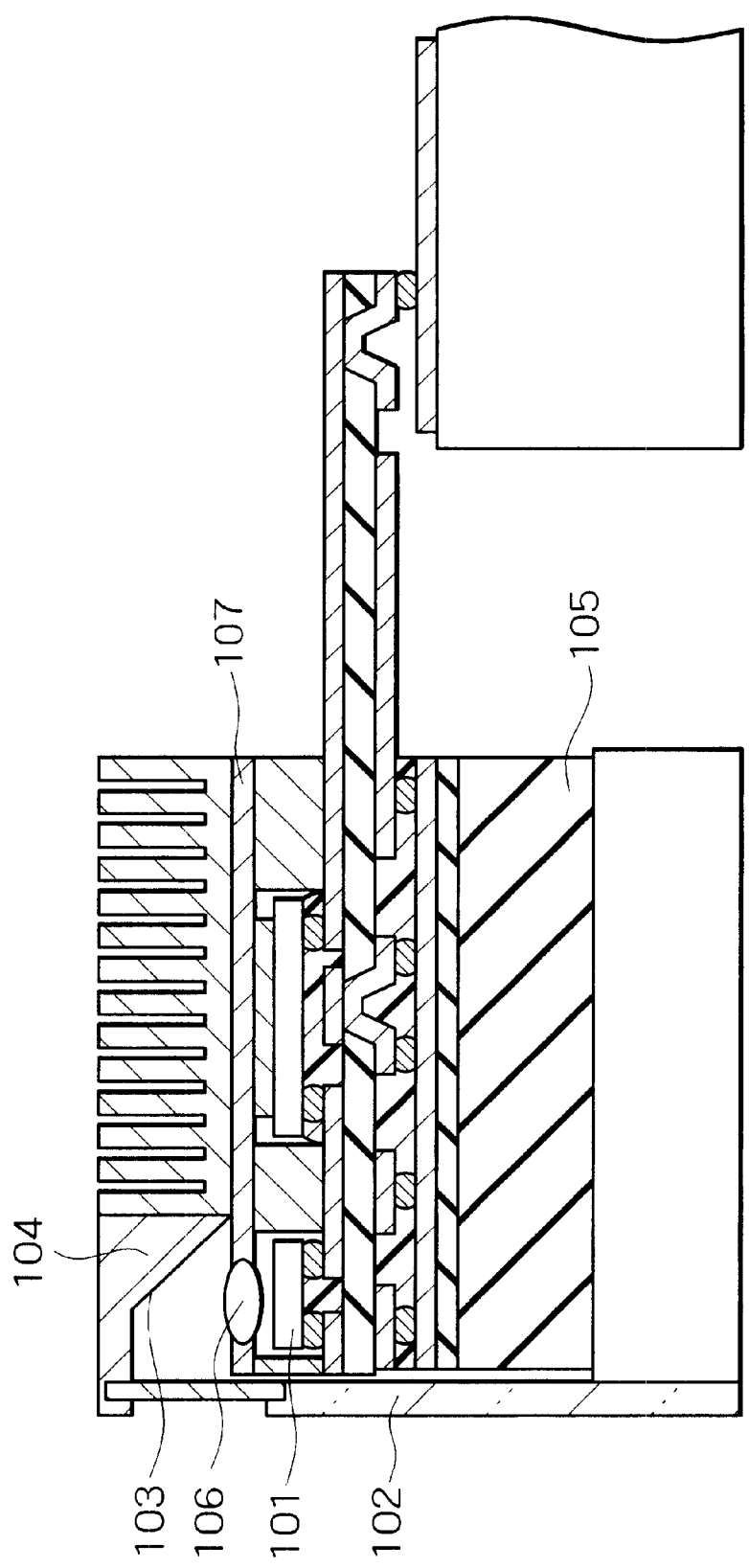
FIG. 6 illustrates a semiconductor device according to a fourth embodiment of the present invention.

A fourth embodiment of the present invention will be explained below with reference to FIG. 6. When an optical element 101 is realized by employing a light emitting element such as a plane emission laser (hereinafter, referred to as VCSEL) or a photo sensitive element such as an PD of the type used to make a light beam enter the rear surface of the PD and further, the element, employed as the optical element 101, whose optical axis is vertical to the surfaces of a flexible film 1 and a Si substrate 105, a metal component 104 having an inclined surface 103 therein is mounted to a glass plate holder 102 and the inclined surface 103 is used as a reflecting surface. In this case, the metal component 104 is adjusted such that the center of the inclined surface 103, i.e., the center of the reflecting surface is positioned on the optical axis (in the case of a light emitting element, the center of the reflecting surface is positioned on a line that passes through the center of a light emitting portion of the element and in the case of a photo sensitive element, it is positioned on a line that passes through the center of a light receiving surface of the element) of the optical element 101.

Furthermore, the optical element 101 may be mounted on either the optical element mounting substrate or the flexible sub-package. Moreover, the Si substrate 105 of the optical element mounting substrate is not limited to a Si substrate, but may be a metal substrate, etc., and may be realized by employing a substrate suitably available to mount the optical element 101 thereon.

Additionally, when the embodiment needs a lens 106, previously fixing the lens 106 to a heat spreader 107 allows achievement of the semiconductor package structure having a lens function added thereto. In addition, when the package structure is coupled to an optical fiber, etc., and has only one lens incorporated therein, positional alignment of an optical axis of the lens becomes difficult, i. e., operation for aligning the orientation of the optical axis relative to associated components within an allowable range of values becomes difficult, increasing the cost of the package structure. To address the above-described problem, the package structure needs to be configured to have two lenses incorporated therein and one of the two lenses is used for roughly adjusting an optical axis, and the other is used for finely adjusting the same. Accordingly, the lens 106 (hereinafter, referred to as a rough adjustment lens) shown in FIG. 6 can be used for roughly adjusting an optical axis.

Figure 7:
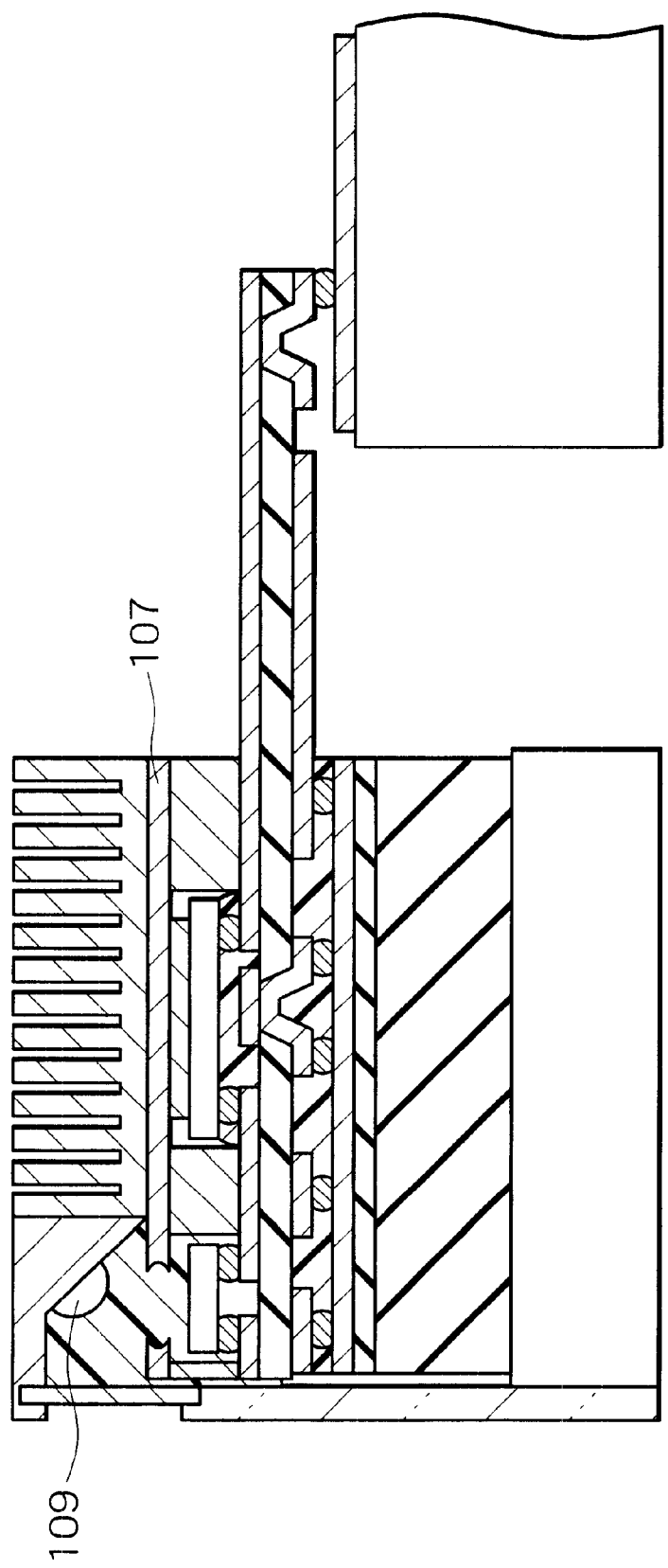
FIG. 7 illustrates a semiconductor device according to a fifth embodiment of the present invention.

FIG. 7 is a cross sectional view illustrating a fifth embodiment of the present invention. Although the fourth embodiment is configured to have the lens 106 mounted on the heat spreader 107, the fifth embodiment is configured differently from the fourth embodiment, so that the lens 106 is not mounted on the heat spreader 107, but a lens 109 having a semi-spherical shape and an appropriate refractive index is disposed in the inclined surface 103 as a reflecting surface.

The lens 109, if necessary, has a non-reflecting film deposited thereon. For example, a transparent resin having an appropriate refractive index is dropped onto the surface of the lens 109 by means of an ink-jet method and is cured to form a curved surface using surface tension of the resin, thereby producing beneficial effects similar to that obtained using the lens 106.

Figure 8:
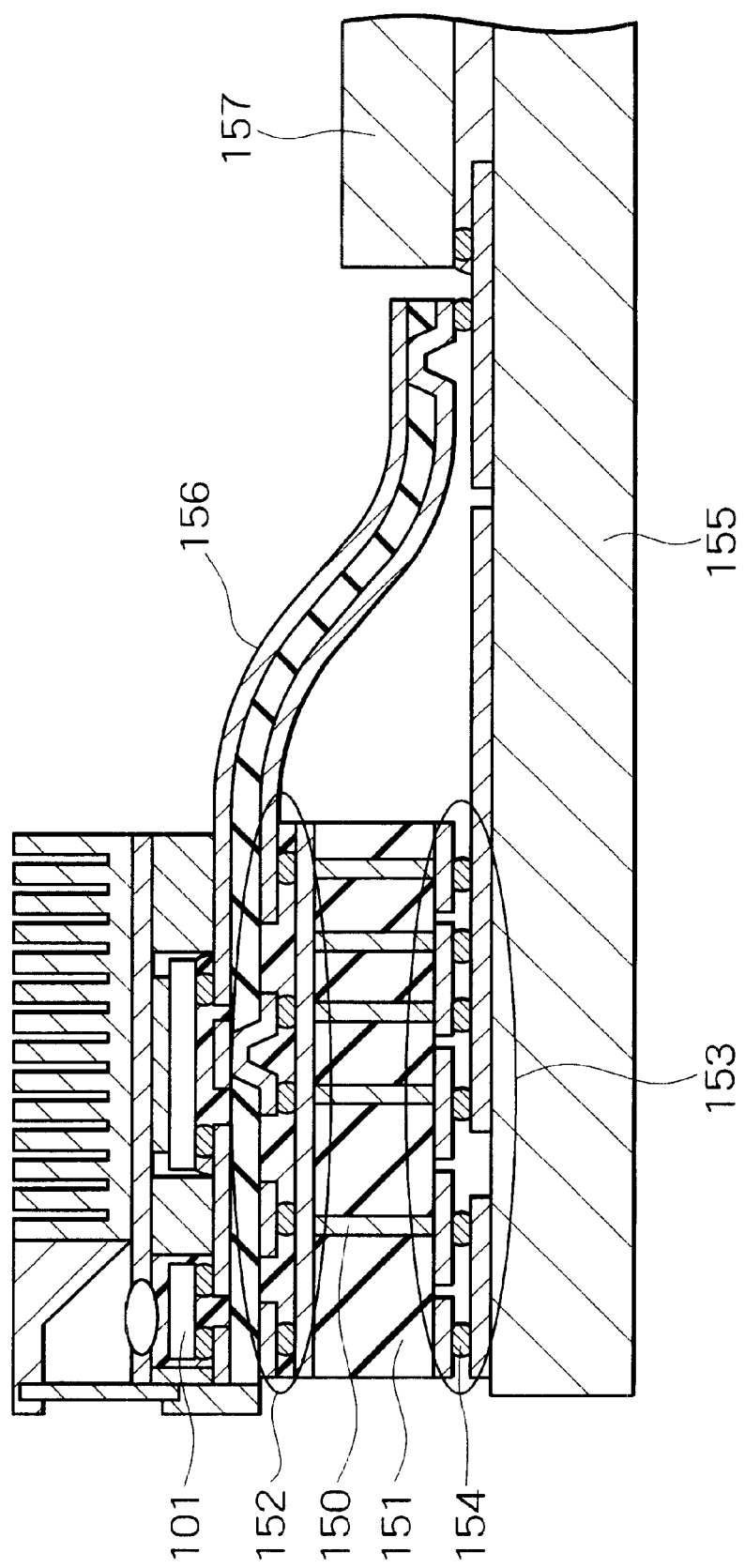
FIG. 8 illustrates a semiconductor device according to a sixth embodiment of the present invention.

A sixth embodiment of the present invention will be explained below with reference to FIG. 8. When a substrate 151 such as a ceramic substrate is employed as an optical element mounting substrate and the substrate 151 is configured to have a via 150 that makes connection between a signal wiring on the upper surface of the substrate and a signal wiring on the lower surface thereof, an interface 152 of a flexible sub-package can provide not only mechanical connection but also electrical connection. That is, the ceramic substrate 151 has a conductive wiring formed on the upper surface of the substrate, which wiring is connected to a lower conductive wiring formed on the lower surface thereof through the via 150, so as to make electrical connection of the substrate to the flexible sub-package, thereby adding a new interface 153 to the semiconductor package structure of the first embodiment. The interface 153 may be configured to make connection between associated portions through a gold bump 154 or a solder. The interface 153 may primarily be used for a low-speed signal such as a power supply signal and a control signal, and may be configured to have a conductive wiring 156, whose characteristic impedance is previously calculated, for a high-speed signal used to transmit a high-speed signal. When the semiconductor device of the embodiment is coupled to a mother board 155 made from a printed wiring board, etc., since the device has both interfaces for a high-speed signal and for a low-speed signal, it can address the need for high packaging density.

The interface 153 is mounted on the mother board 155 through a solder ball 154, etc., and connected to a conductive wiring on the mother board. Furthermore, a high-speed signal is conducted to a point immediately near an LSI 157 on the mother board 155 through the conductive wiring 156 for a high-speed signal and therefore, the length of a conductive wiring on the mother board can be reduced as short as possible. Accordingly, the mother board 155 needs not to transmit a high-speed signal and can be realized by employing an inexpensive multi-layered substrate, allowing a significantly improved degree of freedom in selecting a board as a mother board and high packaging density/low assembling cost of mother board.

As described above, since the optical element 101 and the LSI 157 can be independently selected, the semiconductor package structure can be assembled in high yield and further, since the package structure is directly mounted on the mother board 155, the structure can be assembled at low cost.

Figure 10:
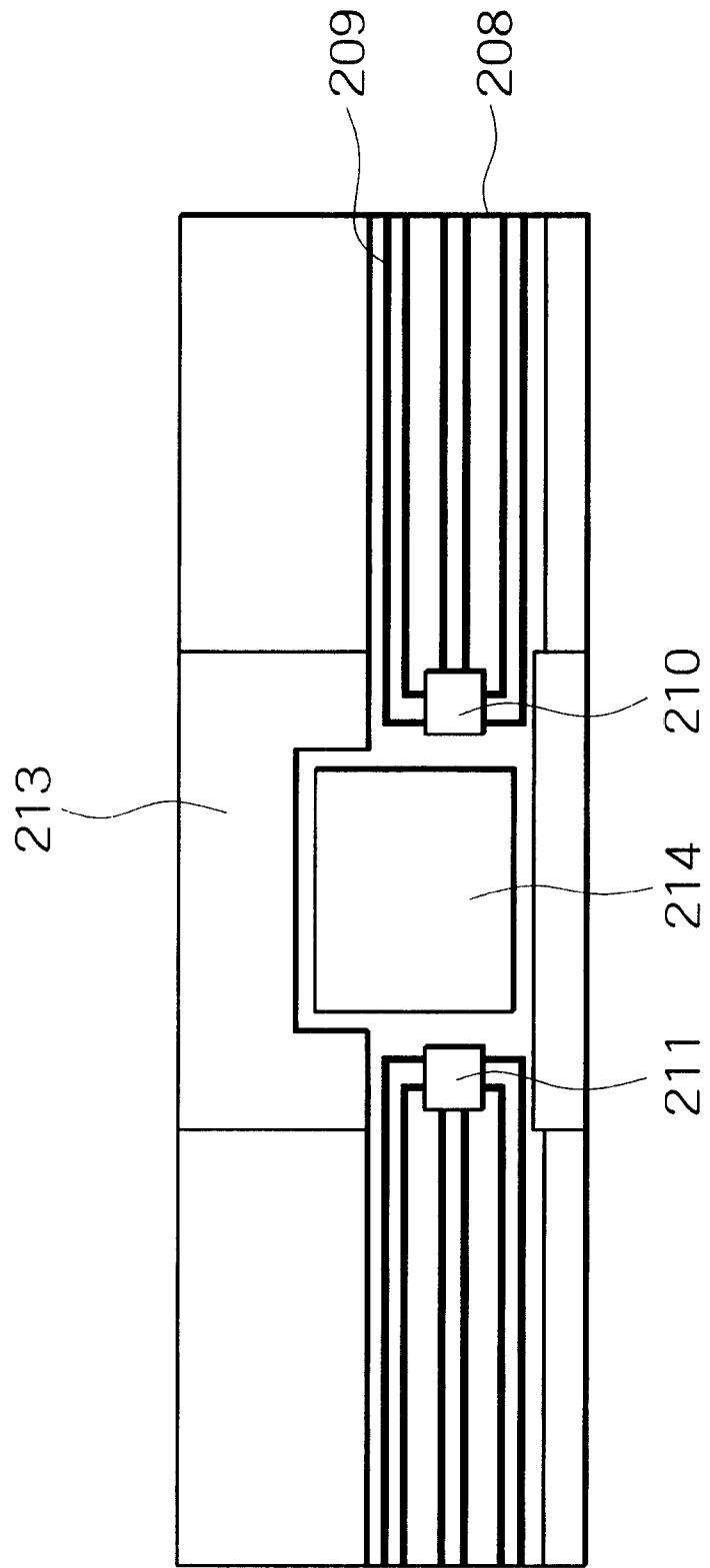
FIG. 10 also illustrates the semiconductor device according to the seventh embodiment.
Figure 11:
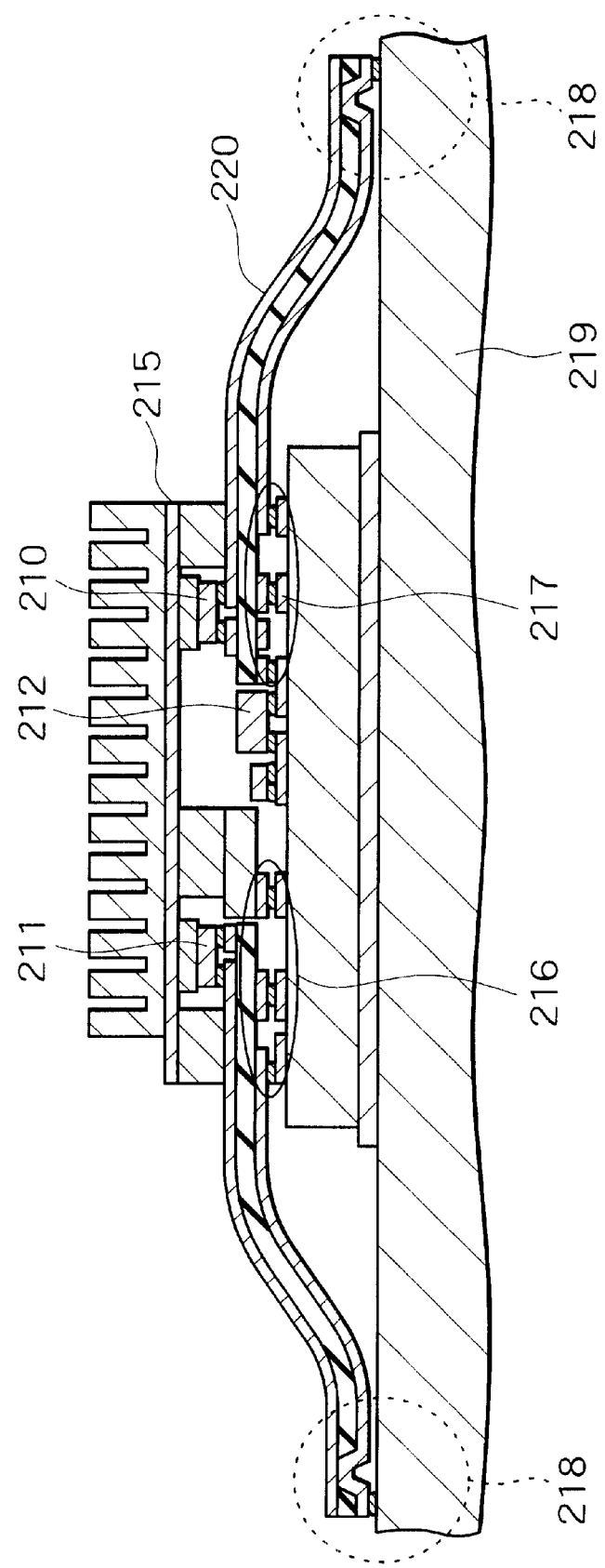
FIG. 11 also illustrates the semiconductor device according to the seventh embodiment.

A seventh embodiment of the present invention will be explained below with reference to FIGS. 9 through 11. The seventh embodiment has a Planar Lightwave Circuit (PLC) package and a flexible sub-package connected to one another through an interface 216 by means of an Au bump 217 or a solder. The PLC package has an optical element assembly mounted on a package 207 in which a groove for retaining in position a ferrule made of ceramic or metal and the optical element assembly comprises: a light emitting element 202 and a Planar Lightwave Circuit element 203 (hereinafter, refer to as PLC) mounted in the assembly; a Si substrate 204 having a groove for housing an end of an optical fiber 206 joined with a ferrule and stopping the end of the fiber at the groove; a resin 205 formed to have a thickness approximately equal to that of the PLC 203; and a photo sensitive element 201 and a TIA 212 light, both being mounted on the resin. The flexible sub-package comprises: a flexible film 208 having a hole 214 or a slit formed therein; wiring patterns 209 formed in conductive layers on both upper and lower surfaces of the flexible film 208; a Post Amp 210, an LSI 211 for driving a light emitting element and a stiffener 213, all those three components being mounted on the flexible sub-package; and a heat spreader 215 mounted on the flexible sub-package as is the case with other embodiments. The light emitting element 202, the LSI 211 for driving a light emitting element, the TIA 212, the Post Amp 210 and a conductive wiring such as a power supply wiring and the ground wiring are electrically connected to one another through the interface 216 or if necessary, may be connected to one another by wire bonding.

Since the package structure according to the seventh embodiment is configured to have the flexible sub-package mounted in a space above the PLC 203, the structure is able to largely reduce its spatial volume and reduce itself in size, in comparison with the conventional package structure having LSIs mounted on the same substrate as that used to mount thereon an optical element. Furthermore, connecting a signal wiring 220 to a mother board 219 through an interface 218 by means of an Au bump or a solder permits package assembly operation to be simplified. In addition, when the signal wiring 220 is realized by employing a conductive wiring, whose characteristic impedance is previously calculated, for a high-speed signal, the signal wiring 220 is able to transmits a signal from an input/output of the LSI 211 for driving a light emitting element and the Post Amp 210 to the interface 218 without making the signal pass through discrete points, whereby the inventive package structure is able to have high frequency performance.

Moreover, since the package structure can be evaluated by only evaluating the optical element mounting substrate, only operation for aligning optical axes of the PLC 203 and the optical element with one another and then selecting the optical element is performed, and at this time point, a defective optical element mounting substrate can be removed. Likewise, connecting the optical element mounting substrate to the flexible sub-package that incorporates LSIs interconnected to one another and previously inspected together with connections between the LSIs allows increase in yield of a module.

Figure 12:
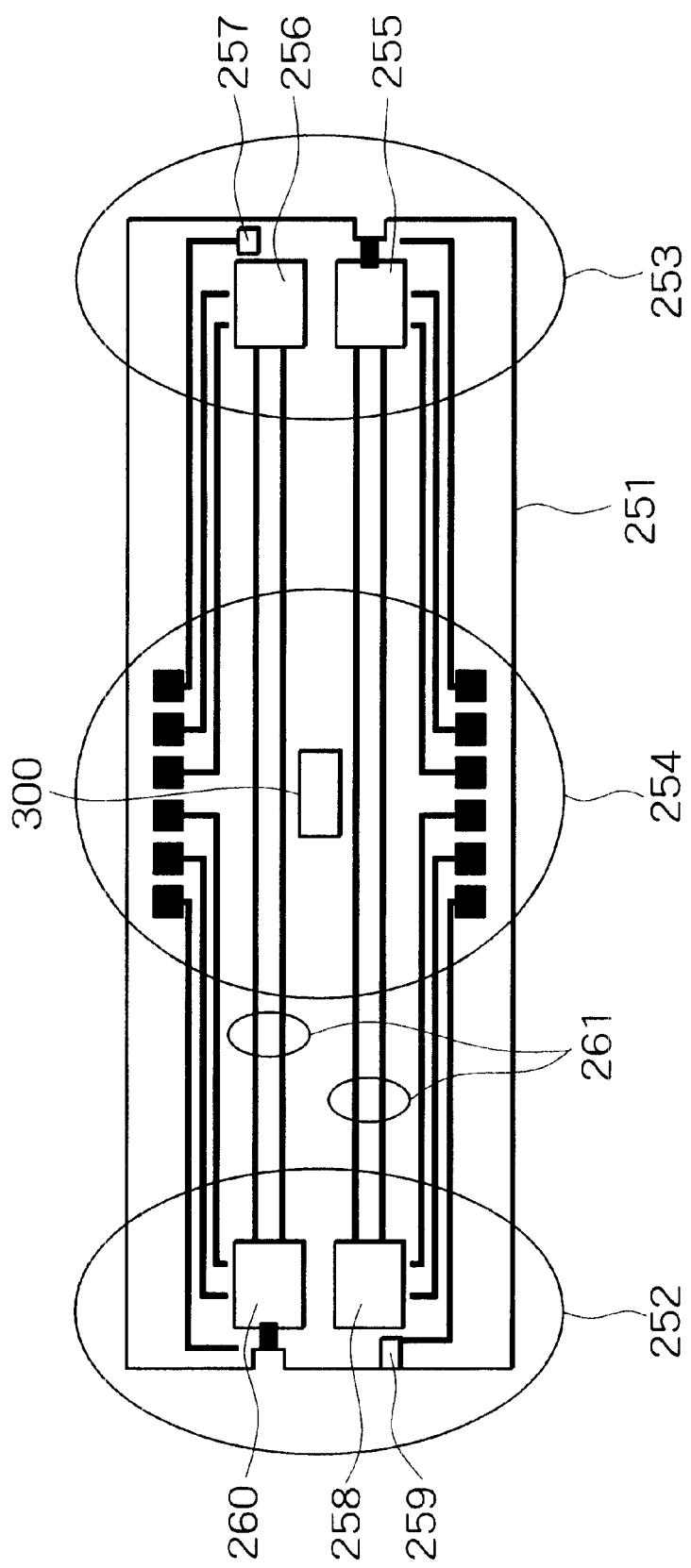
FIG. 12 illustrates a semiconductor device according to an eighth embodiment of the present invention.
Figure 13:
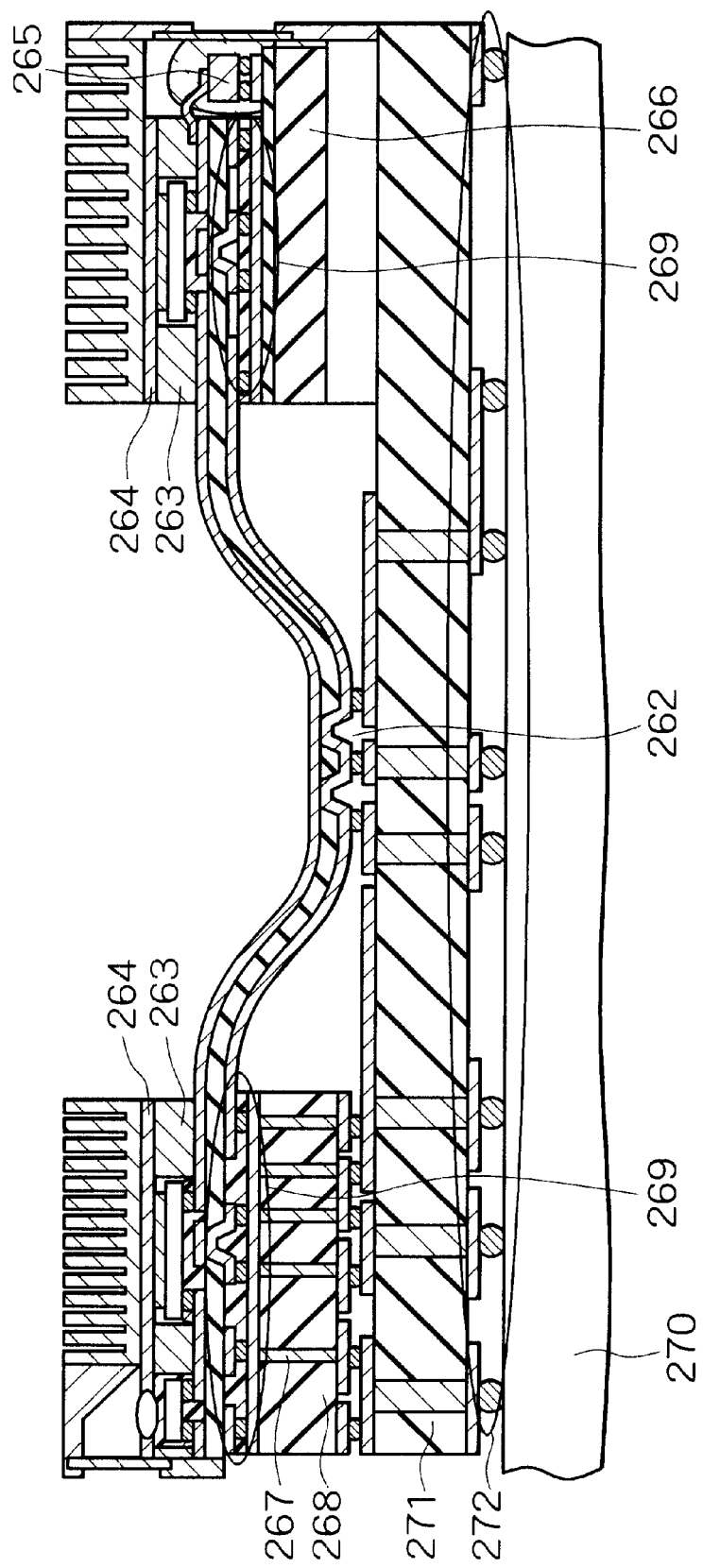
FIG. 13 illustrates a semiconductor device according to a ninth embodiment of the present invention.

An eighth embodiment of the present invention will be explained below with reference to FIGS. 12 and 13. FIG. 12 illustrates a flexible film 251 and it is assumed that when viewing the paper from a direction vertical to the paper, a region of the flexible film 251 near the left end thereof is defined as a port region 252 and a region thereof near the right end thereof is defined as a port region 253, and a region around the center of the flexible film is defined as an electric interface region 254. The electric interface region 254 has an LSI 300 disposed therein such as a wavelength conversion LSI or a signal processing LSI. The port region 253 defined on the flexible film 251 has a transmission LSI 255 such as an LSI for driving a light emitting element mounted on one side of the port region 253 and further, has a reception LSI 256 such as an amplifier and a photo sensitive element 257 mounted on the other side thereof. Likewise, the port region 252 has a reception LSI 258 and a photo sensitive element 259 mounted on one side of the port region 252 and further, has a transmission LSI 260 mounted on the other side thereof. Moreover, an output of the reception LSI 256 in the port region 253 is connected to an input of the transmission LSI 260 in the port region 252 and an output of the reception LSI 258 in the port region 252 is connected to an input of the transmission LSI 255 in the port region 253, and those connections are made using a conductive wiring 261, whose characteristic impedance is previously calculated, for a high-speed signal. Furthermore, the flexible sub-package is constructed such that a variety of signals such as a power supply signal and a control signal from the port regions 252 and 253 are conducted to the electric interface region 254 and connected to a pad 262 formed in a conductive layer on the lower surface of the flexible film through a via, etc. Additionally, a stiffener 263 is mounted around the LSIs in the port regions 252, 253 and a heat spreader 264 is mounted on the stiffener 263 by means of a resin having high thermal conductivity. One optical element mounting substrate is constructed such that a light emitting element 265 is mounted on a substrate 266 such as a Si substrate that is suitably available to mount an optical element thereon and the other element mounting substrate is constructed such that a light emitting element is mounted on a substrate 268 such as a ceramic substrate in which a via 267, etc., can be formed. The assembled flexible sub-package and the optical element assembly board are coupled to one another through an interface 269.

The photo sensitive element 259 and the light emitting element are mounted on the port region 252 and the photo sensitive element 257 and the light emitting element 265 are mounted on the port region 253. If necessary, the photo sensitive elements 257 and 259 may be mounted on the optical element mounting substrate or the light emitting element 265 may be mounted on the flexible film. Furthermore, although the light emitting element and the transmission LSI, or the photo sensitive element and the reception LSI are electrically connected to one another through an Au bump, etc., or if necessary, by wire bonding.

Moreover, the electric interface region 254 has provided therein a variety of LSIs and a conductive wiring for a low-speed signal such as a power supply signal, the ground signal and a control signal and the conductive wiring for a low-speed signal is connected to a mother board 270.

The conductive wiring for a low-speed signal in the electric interface region 254 is connected through a gold bump, a solder or a silver paste to a conductive wiring on an attachment substrate 271 consisting of a printed wiring board configured to have conductive wirings provided on both surfaces of the board. In this case, since the flexible sub-package is able to change it profile, the surface of the above-described optical element mounting substrate and the lower surface of the conductive layer of the electric interface region 254 can easily be positioned at the same level, eliminating the need for the use of a specific component such as a block configured to have conductive wirings on both surfaces of the block and then facilitating operation for assembling associated components.

The attachment substrate 271 has conductors passing therethrough from the upper surface to the lower surface thereof and the lower conductive wiring of the electric interface region 254 and if necessary, the lower conductive wiring of the optical element mounting substrate are electrically connected to the upper conductive wiring of the attachment substrate 271 through a gold bump, a solder or a silver paste. Connecting the attachment substrates 271 along with the optical element mounting substrates and the flexible sub-package to the mother boards 270 through an interface 272 provided on the lower surface of the attachment substrate 271 allows electrical connection of the flexible sub-package to the mother board 270 through the attachment substrate 271.

Since a high-speed signal is transmitted through the conductive wiring 261 for a high-speed signal on the flexible sub-package, the attachment substrate 271 needs not to have high rate transmission performance, allowing a significantly improved degree of freedom in selecting a substrate as an attachment substrate and low assembly cost of attachment substrate.

Furthermore, mounting a retiming LSI such as a Clock data recovery (CDR) circuit as a reception-side LSI at the stage subsequent to a reception-side amplifier allows the package structure to additionally have a function of shaping a signal waveform.

Figure 9:
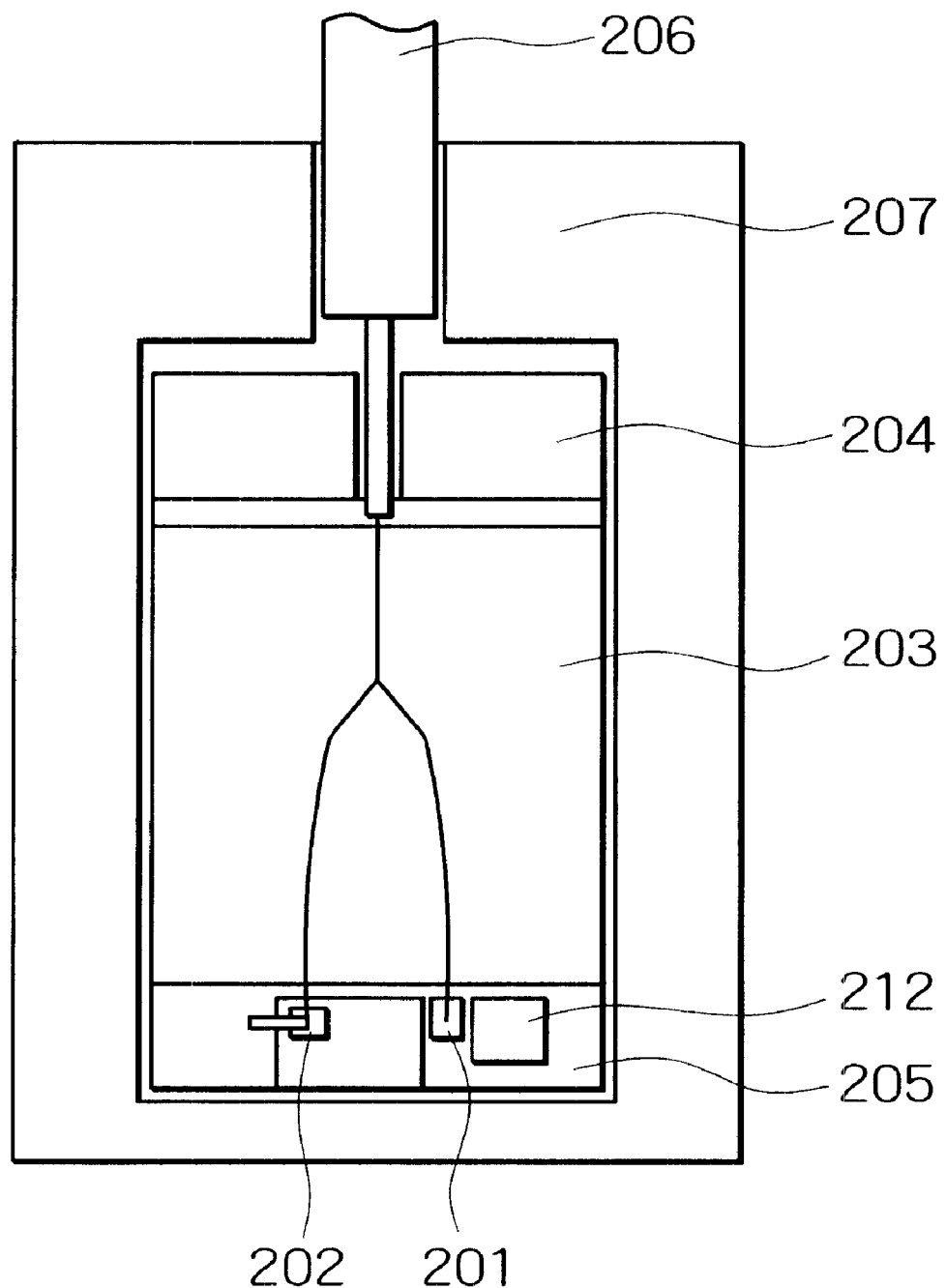
FIG. 9 illustrates a semiconductor device according to a seventh embodiment of the present invention.

In the above-described ninth embodiment shown in FIG. 9, although the optical element mounting substrates in the port regions 252, 253 are made from substrates different from one another, for example, it is possible to make the package structure of the embodiment serve as a media converter that couples links having different wavelengths by employing light emitting elements whose optical axes are oriented in directions different from one another. In more detail, for example, one of the light emitting elements is a light emitting element such as VCSEL having a wavelength of 850 nm and the other is a light emitting element having a wavelength of 1310 nm or 1550 nm. Moreover, when employing optical element mounting substrates made from the same substrate in the embodiment, it is also possible to apply the package structure of the embodiment to a transponder for shaping a signal waveform.

Furthermore, although the above-described embodiment is constructed such that the flexible sub-package is assembled as one unit, if necessary, the embodiment may be constructed so that the flexible sub-package is divided into the port region 252 and the port region 253, and the port regions are individually assembled, and then are coupled together.

The embodiment may be configured to have an encapsulation resin, a lens mechanism, a light reflecting portion, a glass window for making connection to an optical fiber, etc., provided in a fashion similar to that employed to construct those components of the embodiments 1 through 7.

According to the ninth embodiment, operation for performing optical-electronic-optical conversion is made extremely simplified and assembling can be performed in such a manner that the optical element mounting substrate and an electrical signal processing unit such as an LSI are individually assembled followed by individual selection of the board and the unit, and then, the board and the unit are connected to one another through the interface 269 and the interface 272 as described above, thereby allowing optical-electronic-optical conversion to be made at low cost. Furthermore, if necessary, the embodiment can be modified as is the case with the above-described embodiments 1 through 7.

As described so far, according to the present invention, the semiconductor package structure is able to have a high heat removal ability without sacrificing its electrical performance and enables time efficiency in package design associated with package assembly and reduced assembly cost.

What is claimed is:

1. A semiconductor device comprising:
   an insulating film;
   first and second conductive layers formed on both surfaces of said insulating film and constituting wiring patterns respectively, said first and second conductive layers being constructed such that a part of each of said wiring patterns formed in said first and second conductive layers is a conductive wiring for a high-speed signal, designed taking into account high frequency characteristic of said conductive wiring based on characteristic impedance of said conductive wiring;
   an integrated circuit mounted on said first conductive layer; and
   a conductor connecting said wiring pattern formed in said first conductive layer and said wiring pattern formed in said second conductive layer to one another,
   said insulating film being further constructed such that a portion of said insulating film is mounted on a substrate used to mount thereon an object, said portion being occupied by said integrated circuit, and a connection portion for making connection to a different substrate is provided at an end of said insulating film located outside said substrate used to mount thereon an object.

2. The semiconductor device according to claim 1, wherein said insulating film is an insulating flexible film capable of changing a profile of said insulating flexible film.

3. The semiconductor device according to claim 1, wherein said substrate used to mount thereon an object is one of a silicon substrate and a metal substrate.

4. The semiconductor device according to claim 1, further comprising:
   a stiffener made of one of metal and alloy, and mounted on a circumference of said integrated circuit on said insulating film; and
   a heat spreader supported by said stiffener and contacting said integrated circuit.

5. The semiconductor device according to claim 4, further comprising a heat sink provided to contact said heat spreader and having a plurality of fins provided therein.

6. The semiconductor device according to claim 1, further comprising:
   an optical element mounted on said substrate used to mount thereon an object;
   a third conductive layer provided on said substrate used to mount thereon an object and constituting a wiring pattern; and
   a connection portion making electrical connection between said wiring pattern formed in said third conductive layer and said wiring pattern formed in said second conductive layer, and made from one of a solder and a gold bump.

7. The semiconductor device according to claim 6, wherein an optical axis of said optical element is parallel to a surface of said substrate used to mount thereon an object and said semiconductor device further comprises:
   a side plate disposed on a side surface of said substrate used to mount thereon an object;
   a transparent window provided at a position of said side plate, said position being determined such that said side plate and said optical axis cross one another; and
   a transparent resin filling a space between said optical element and said transparent window.

8. The semiconductor device according to claim 1, further comprising another integrated circuit mounted on said third conductive layer on said substrate used to mount thereon an object.

9. The semiconductor device according to claim 6, wherein an optical axis of said optical element extends toward a surface of said substrate used to mount thereon an object in a direction vertical to said surface of said substrate used to mount thereon an object and said semiconductor device further comprises:
   a light reflecting portion formed of an inclined surface and provided at a position of a surface of said substrate used to mount thereon an object, said position being determined such that said surface and said optical axis cross one another;

a side plate disposed on a side surface of said substrate used to mount thereon an object;

a transparent window provided at a position of said side plate, said position being determined such that said side plate and said optical axis cross one another; and a transparent resin filling a space between said optical element and said transparent window.

10. The semiconductor device according to claim 9, wherein said substrate used to mount thereon an object is a silicon substrate and said inclined surface is formed by etching with KOH, and a metal film is formed on said inclined surface by metallization to constitute said light reflecting portion.

11. The semiconductor device according to claim 9, wherein said substrate used to mount thereon an object is a metal substrate and said inclined surface is formed by mechanical processing to constitute said light reflecting portion.

12. The semiconductor device according to claim 1, further comprising:

an optical element mounted on said first conductive layer on said insulating film;

a third conductive layer provided on said substrate used to mount thereon an object and constituting a wiring pattern; and a connection portion making electrical connection between said wiring pattern formed in said third conductive layer and said wiring pattern formed in said second conductive layer, and made from one of a solder and a gold bump.

13. The semiconductor device according to claim 12, wherein an optical axis of said optical element extends toward a surface of said insulating film in a direction vertical to said surface of said insulating film and said semiconductor device further comprises:

one of a hole and a transparent portion provided at a position of said insulating film, said position being determined such that said insulating film and said optical axis cross one another;

a light reflecting portion for changing an orientation of said optical axis;

a side plate disposed on a side surface of said substrate used to mount thereon an object; and a transparent window provided at a position of said side plate, said position being determined such that said side plate and said optical axis cross one another.

14. The semiconductor device according to claim 13, wherein said light reflecting portion comprises:

an inclined surface formed on a surface of said substrate used to mount thereon an object; and a metal film formed on said inclined surface by metallizing said inclined surface.

15. The semiconductor device according to claim 12, wherein an optical axis of said optical element extends remotely from a surface of said insulating film in a direction vertical to said surface of said insulating film and said semiconductor device further comprises:

a light reflecting portion for changing an orientation of said optical axis in order to make said optical axis parallel to a surface of said substrate used to mount thereon an object;

a side plate disposed on a side surface of said substrate used to mount thereon an object; and a transparent window provided at a position of said side plate, said position being determined such that said side plate and said optical axis cross one another.

16. The semiconductor device according to claim 15, wherein said light reflecting portion is constituted by an inclined surface made from one of a metal member and an alloy member, and provided on a side opposite said optical element relative to said insulating film.

17. The semiconductor device according to claim 16, further comprising a lens disposed on said optical axis between said light reflecting portion and said inclined surface.

18. The semiconductor device according to claim 17, wherein said lens is a semi-spherical material provided in said inclined surface of said light reflecting portion and having a refractive index different from a refractive index of a portion surrounding said material.

19. The semiconductor device according to claim 18, wherein a region between said optical element and said lens is filled with a transparent resin.

20. The semiconductor device according to claim 1, wherein said substrate used to mount thereon an object comprises:

a fourth conductive layer formed on a rear surface of said substrate used to mount thereon an object; and a conductive layer for making electrical connection between said wiring pattern constituted by said third conductive layer and a wiring pattern constituted by said fourth conductive layer.

21. The semiconductor device according to claim 20, further comprising a fifth conductive layer formed on a surface of said another substrate, wherein said substrate used to mount thereon an object is mounted on said another substrate and said wiring pattern constituted by said fourth conductive layer and a wiring pattern constituted by said fifth conductive layer are connected to one another.

22. The semiconductor device according to claim 21, wherein said fourth conductive layer and said fifth conductive layer are connected to one another through one of a solder and a gold bump.

23. The semiconductor device according to claim 6, wherein said optical element constitutes two optical elements provided on said substrate used to mount thereon an object and said two optical elements are a photo sensitive element and a light emitting element respectively, and said semiconductor device further comprises:

an optical fiber disposed in a V-shaped groove provided in a surface portion of said substrate used to mount thereon an object; and a light guide for making optical connection between said photo sensitive element and said optical fiber and between said light emitting element and said optical fiber.

24. The semiconductor device according to claim 1, wherein said integrated circuit comprises:

a pair of a first transmission integrated circuit and a first reception integrated circuit, mounted on one end of said first conductive layer; and a pair of a second transmission integrated circuit and a second reception integrated circuit, mounted on the other end of said first conductive layer and disposed at a location symmetric with respect to a point corresponding to said pair of said first transmission integrated circuit and said first reception integrated circuit, wherein an input of said first transmission integrated circuit and an output of said second reception integrated circuit are connected to one another, and an output of said first reception integrated circuit and an input of said second transmission integrated circuit are connected to one another, and corresponding connection between said output and said input is made through said conductive wiring, formed in at least one of said first and second conductive layers, for a high-speed signal.

* * * * *